United States Patent
Mazhari et al.

(10) Patent No.: US 9,536,935 B2
(45) Date of Patent: Jan. 3, 2017

(54) ORGANIC THIN FILM TRANSISTOR MERGED WITH A LIGHT EMITTING DIODE USING AN ACCUMULATION LAYER AS ELECTRODE

(71) Applicant: INDIAN INSTITUTE OF TECHNOLOGY KANPUR, Kanpur (IN)

(72) Inventors: Baquer Mazhari, Kanpur (IN); Ankita Gangwar, Kanpur (IN)

(73) Assignee: INDIAN INSTITUTE OF TECHNOLOGY KANPUR (IN)

( * ) Notice: Subject to any disclaimer, the term of this patent is extended or adjusted under 35 U.S.C. 154(b) by 0 days.

(21) Appl. No.: 14/644,220

(22) Filed: Mar. 11, 2015

(65) Prior Publication Data

US 2015/0262531 A1   Sep. 17, 2015

(30) Foreign Application Priority Data

Mar. 12, 2014   (IN) .............................. 708/DEL/2014

(51) Int. Cl.
*G09G 3/32* (2016.01)
*H01L 27/32* (2006.01)

(52) U.S. Cl.
CPC ................................. *H01L 27/3274* (2013.01)

(58) Field of Classification Search
CPC .. G06F 3/042; G06F 3/0412; G09G 2360/144; G09G 3/3406; H01L 27/3274
USPC .... 345/80; 257/72, 223, 227, 291, 292, 439, 257/443, 655, E27.1, E27.125, E27.112, 257/E29.117, E29.145, E29.147, E29.151, 257/E29.182, E29.202, E29.273–E29.299, 257/E29.314, E29.32, E23.016
See application file for complete search history.

(56) References Cited

U.S. PATENT DOCUMENTS

| | | |
|---|---|---|
| 6,924,503 B2 | 8/2005 | Cheng et al. |
| 8,013,328 B2 | 9/2011 | Burroughes et al. |
| 2012/0176356 A1* | 7/2012 | Usukura ............... G06F 3/0416 345/207 |
| 2012/0176357 A1* | 7/2012 | Katoh ................... G06F 3/0412 345/207 |

(Continued)

OTHER PUBLICATIONS

Ankita Gangwar et al., "An Organic Device with Thin Film Transistor Merged with Light Emitting Diode Through Use of an Accumulation Layer in TFT as an Electrode", ECS Transactions, May 2015, pp. 199-204, vol. 67, No. 1.

(Continued)

*Primary Examiner* — David Vu
*Assistant Examiner* — Jonathan Han
(74) *Attorney, Agent, or Firm* — Ren-Sheng International

(57) ABSTRACT

A novel light-emitting device includes an organic thin-film structure that is merged with an organic light-emitting diode structure by utilizing a part of the electron accumulation layer in the organic thin-film transistor as a common electrode for each structure. The organic thin-film structure and the organic light-emitting diode structure each include an organic semiconductor that comprises a material in which hole mobility is greater in a bulk region of the material than electron mobility in the bulk region. The advantages of such a light-emitting device include less complex processing and a simpler pixel circuit structure in comparison to separately fabricating OTFT and OLED structures and subsequently interconnecting them to form a pixel. Furthermore, relative to a light-emitting transistor, some embodiments offer the advantage of a broader light emission area more suitable for use in display devices.

27 Claims, 5 Drawing Sheets

(56) References Cited

U.S. PATENT DOCUMENTS

2014/0027758 A1* 1/2014 Hong ............... H01L 29/78648
257/43

OTHER PUBLICATIONS

Weiran Cao et al., "Flexible Organic Solar Cells Using an Oxide/Metal/Oxide Trilayer as Transparent Electrode", Organic Electronics, Nov. 2012, pp. 2221-2228, vol. 13, No. 11.

Raffaella Capelli et al., "Organic Light-Emitting Transistors with an Efficiency that Outperforms the Equivalent Light-Emitting Diodes", Nature Materials, Jun. 2010, pp. 496-503, vol. 9.

Seungjun Chung et al., "All-Inkjet-Printed Organic Thin-Film Transistor Inverter on Flexible Plastic Substrate", IEEE Electron Device Letters, Aug. 2011, pp. 1134-1136, vol. 32, No. 8.

Fabio Cicoira et al., "Organic Light Emitting Field Effect Transistors: Advances and Perspectives", Advanced Functional Materials, Nov. 2007, pp. 3421-3434, vol. 17.

Arved C. Hübler et al., "Fully Mass Printed Loudspeakers on Paper", Organic Electronics, Nov. 2012, pp. 2290-2295, vol. 13.

Jin Jang, "Displays Develop a New Flexibility", Materials Today, Apr. 2006, pp. 46-52, vol. 9, No. 4.

Hagen Marien et al., "A Fully Integrated ADC in Organic Thin-Film Transistor Technology on Flexible Plastic Foil", IEEE Journal of Solid-State Circuits, Jan. 2011, pp. 276-284, vol. 46, No. 1.

M. A. McCarthy et al., "Low-Voltage, Low-Power, Organic Light-Emitting Transistors for Active Matrix Displays", Science, Apr. 29, 2011, pp. 570-573, vol. 332.

Sang-Hee K. Park et al., "Transparent and Photo-stable ZnO Thin-film Transistors to Drive an Active Matrix Organic-Light-Emitting-Diode Display Panel", Advanced Materials, 2009, pp. 678-682, vol. 21.

Kalluri R. Sarma et al., "Flexible Active Matrix Organic Light Emitting Diode (AM OLED) Displays", Proc. of ASID '06, Oct. 8-12, pp. 337-342.

Hisahiro Sasabe et al., "Ultra High-Efficiency Multi-Photon Emission Blue Phosphorescent OLEDs with External Quantum Efficiency Exceeding 40%", Organic Electronics, Nov. 2012, pp. 2615-2619, vol. 13.

C. Tanase et al., "Origin of the Enhanced Space-Charge-Limited Current in Poly (p-phenylene vinylene)", Physical Review B 70, 2004, pp. 193202-1-193202-4.

Alejandro De La Fuente Vornbrock et al., "A Comparison of Processes and Challenges Between Organic, a-Si:H, and Oxide TFTs for Active Matrix Backplanes on Plastic", 19th International Workshop on Active-Matrix Flatpanel Displays and Devices (AM-FPD), Jul. 4-6, 2012, pp. 57-60.

Jana Zaumseil et al., "Spatial Control of the Recombination Zone in an Ambipolar Light-Emitting Organic Transistor", Nature Materials, Jan. 2006, pp. 69-74, vol. 5.

\* cited by examiner

ORGANIC THIN FILM TRANSISTOR MERGED WITH A LIGHT EMITTING DIODE USING AN ACCUMULATION LAYER AS ELECTRODE

CROSS-REFERENCE TO RELATED APPLICATION

This application claims priority to Indian Patent Application 708/DEL/2014, filed Mar. 12, 2014. The Indian Patent Application, including any appendices or attachments thereof, is incorporated by reference herein in its entirety.

BACKGROUND

Unless otherwise indicated herein, the approaches described in this section are not prior art to the claims in this application and are not admitted to be prior art by inclusion in this section.

Organic semiconductor devices such as organic light emitting diodes (OLED), organic thin film transistors (OTFT), organic solar cells (OSC), and the like, are being actively developed for multiple applications. This is because printing techniques can be used to fabricate such devices, which facilitates low-cost manufacturing of semiconductor devices and the introduction of new and flexible substrates for semiconductor devices, such as plastic or paper substrates. Consequently, OLEDs have reached a high level of maturity and have found commercial application in the field of electronic displays, with examples including simple MP3 players, smartphones, and flat panel TVs.

SUMMARY

In accordance with at least some embodiments of the present disclosure, a light-emitting device comprises an organic light-emitting diode and a thin film transistor. The organic light-emitting diode includes an organic semiconductor that comprises a material in which a hole mobility is greater in a bulk region of the material than an electron mobility in the bulk region, is formed on a first surface of an insulator layer, and is electrically coupled to a first electrode configured to inject holes into the organic semiconductor material. The thin film transistor includes the organic semiconductor, a second electrode that is disposed on a second surface of the insulator layer and is configured as a gate electrode for the thin film transistor, and a third electrode disposed on the first surface of the insulator layer and is electrically coupled to the organic semiconductor and is configured to function as a source electrode for the thin film transistor, wherein the thin film transistor is operable to form an electron accumulation layer at an interface between the organic semiconductor and the insulator substrate, the electron accumulation layer being operable to inject electrons into the organic semiconductor, and wherein at least a portion of the electron accumulation layer is configured to function as a drain electrode for the thin film transistor and as a cathode of the organic light-emitting diode.

In accordance with at least some embodiments of the present disclosure, a computing device comprises a memory, a processor coupled to the memory, and a light-emitting device coupled to the processor, the light-emitting device including an organic light-emitting diode and a thin film transistor. The organic light-emitting diode includes an organic semiconductor that comprises a material in which a hole mobility is greater in a bulk region of the material than an electron mobility in the bulk region, is formed on a first surface of an insulator layer, and is electrically coupled to a first electrode configured to inject holes into the organic semiconductor material. The thin film transistor includes the organic semiconductor, a second electrode that is disposed on a second surface of the insulator layer and is configured as a gate electrode for the thin film transistor, and a third electrode disposed on the first surface of the insulator layer and is electrically coupled to the organic semiconductor and is configured to function as a source electrode for the thin film transistor, wherein the thin film transistor is operable to form an electron accumulation layer at an interface between the organic semiconductor and the insulator substrate, the electron accumulation layer being operable to inject electrons into the organic semiconductor, and wherein at least a portion of the electron accumulation layer is configured to function as a drain electrode for the thin film transistor and as a cathode of the organic light-emitting diode.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

Figure 1:
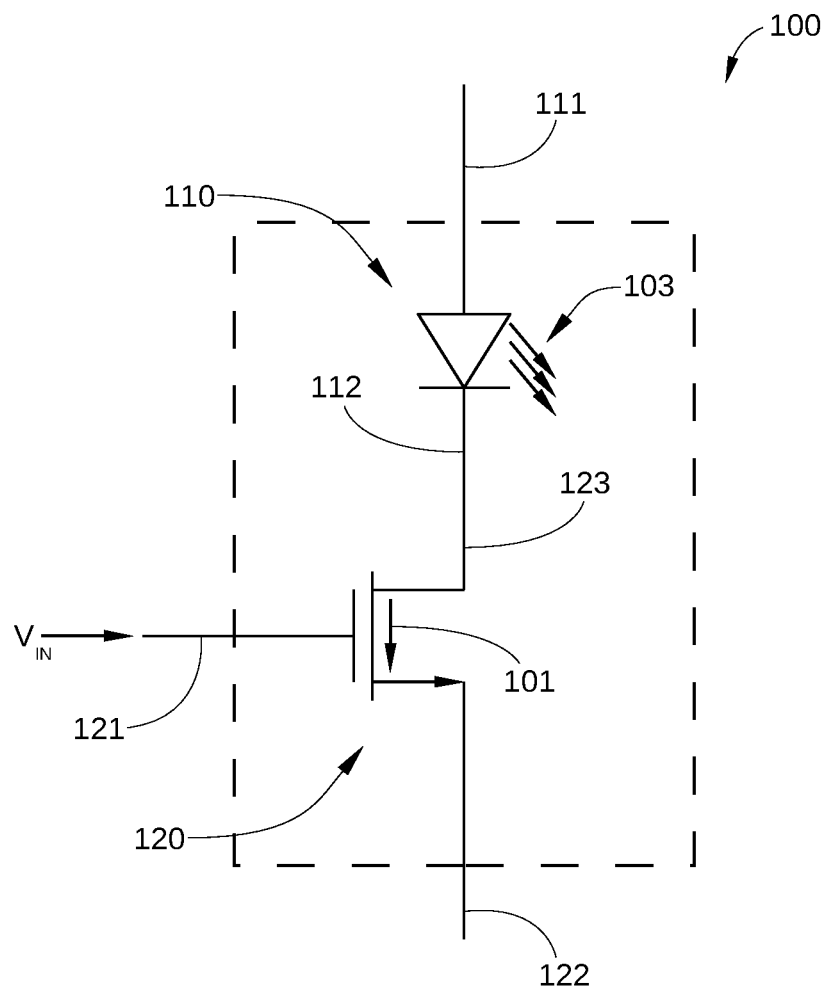
FIG. 1 illustrates a circuit diagram of a merged organic thin film transistor-light emitting diode (MOTLED), arranged in accordance with at least some embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the disclosure, as generally described herein, and illustrated in the Figures, can be arranged, substituted, combined, and designed in a wide variety of different configurations, all of which are explicitly contemplated and make part of this disclosure.

Organic light-emitting diodes (OLEDs) are widely used in commercial applications, including MP3 players, smartphones, and flat panel TVs. For simple low-resolution displays, a passive matrix OLED (PMOLED) display consisting of rows and columns of OLEDs is generally sufficient, and is formed by organic layers disposed between strips of cathode and anode material. The anode strips are arranged perpendicular to the cathode strips, so that the pixels of the passive matrix OLED are defined by the intersections of the cathode strips and the anode strips. PMOLEDs are relatively easy to manufacture, but generally consume more power, primarily due to the high current required for the short ON duration. PMOLEDs are most efficient for text and icons and are best suited for small screens (two- to three-inch diagonal) such as those found in cell phones, personal digital assistants, and MP3 players.

For high resolution displays, an active matrix OLED (AMOLED) is typically used that includes a thin-film transistor (TFT) backplane in addition to the OLED matrix. In an AMOLED device the TFT array in the backplane is the circuitry that determines which pixels get turned on to form an image. Consequently, AMOLED devices consume less power than PMOLEDs, and are therefore more suitable for large displays. Furthermore, AMOLEDs have faster refresh rates, making them more suitable for displaying video. Conventionally, two very different technologies are used in the fabrication of AMOLED devices, making the manufacture of AMOLED displays complex and expensive. One technology is used to form a backplane with an amorphous silicon- or polysilicon or amorphous oxide based TFT array and another technology with organic materials is used to form an OLED array. The subsequent interconnection of these two separately fabricated elements further increases manufacturing cost and expense.

According to some embodiments of the disclosure, a merged organic TFT-LED (hereinafter referred to as a MOTLED) structure is provided. The MOTLED is an organic thin film transistor (OTFT) combined with an organic light emitting diode (OLED), which are each formed together on a single substrate. In addition, the OTFT and the OLED may be formed with the same organic semiconductor layer, where a portion of the organic semiconductor layer is configured as an electron accumulation layer that can serve as the cathode of the OLED and as the drain electrode of the OTFT. The MOTLED allows an AMOLED array to be formed on a single organic or polymer TFT backplane, which may be a flexible substrate. Furthermore, use of the herein described MOTLED simplifies the external interconnection process between separately fabricated OTFT and OLED arrays, greatly simplifying the manufacture of AMOLED displays. Because the same MOTLED device can be operated as a normal transistor, the MOTLED device can be used in place of other transistors in a pixel circuit. Thus only one device instead of two (OLED and TFT) needs to be fabricated, thereby reducing the process steps.

FIG. 1 illustrates a circuit diagram of a MOTLED 100, arranged in accordance with at least some embodiments of the present disclosure. MOTLED 100 includes an OLED 110 coupled to an organic thin film transistor (OTFT) 120 in a single transistor structure. As shown, a voltage $V_{IN}$ applied to gate electrode 121 controls current 101 between source electrode 122 and drain electrode 123 of OTFT 120. Current 101 also flows through OLED 110, from anode 111 to cathode 112, as electrons are injected into the LUMO of an organic semiconductor layer from a portion of the accumulation layer of the OTFT and hence acting as cathode 112 for the OLED and withdrawn from the highest occupied molecular orbital (HOMO) of the organic semiconductor layer at anode 111. This latter process may also be described as the injection of holes into the HOMO of the organic semiconductor layer from anode 111. Electrostatic forces bring the electrons and the holes towards each other to recombine, forming an exciton, which is a bound state of the electron and hole. The decay of this excited state results in a relaxation of the energy levels of the electron, accompanied by emission of radiation 103 whose frequency is in the visible region. The frequency of this radiation depends on the band gap of the material, in this case the difference in energy between the HOMO (highest occupied molecular orbit) and LUMO (lowest unoccupied molecular orbital) of the organic semiconductor layer.

It is noted that MOTLED 100 is in some ways similar to a known device that also provides the functionality of an OTFT and an OLED within a single structure, the so-called organic light-emitting transistor (OLET). However, OLETs have the disadvantage that emission often comes from a narrow region within the channel of the transistor, resulting in a linear, or strip-like, emissive region rather than a broad planar emission region that is more suitable for displays. This is because an OLET in operation is more like an N-type and P-type OTFT in series rather than an OTFT and an OLED in series, and the emissive region of the OLET corresponds to the line interface in the channel region between the electron accumulation layer and the hole accumulation layer of the OLET. Moreover, the drain voltage in an OLET is also generally much larger than gate voltage, resulting in high-voltage operation.

In contrast to the above-described OLET, according to some embodiments of MOTLED 100, an electron accumulation layer (described below in conjunction with FIG. 2) in the organic semiconductor layer of MOTLED 100 serves as cathode 112 of OLED 110 and as drain electrode 123 of OTFT 120. Thus, in such embodiments of MOTLED 100, OLED 110 does not include a metallic electrode configured to inject electrons into the semiconductor material, and OTFT 120 does not include a metallic electrode configured as a drain electrode.

Figure 2:
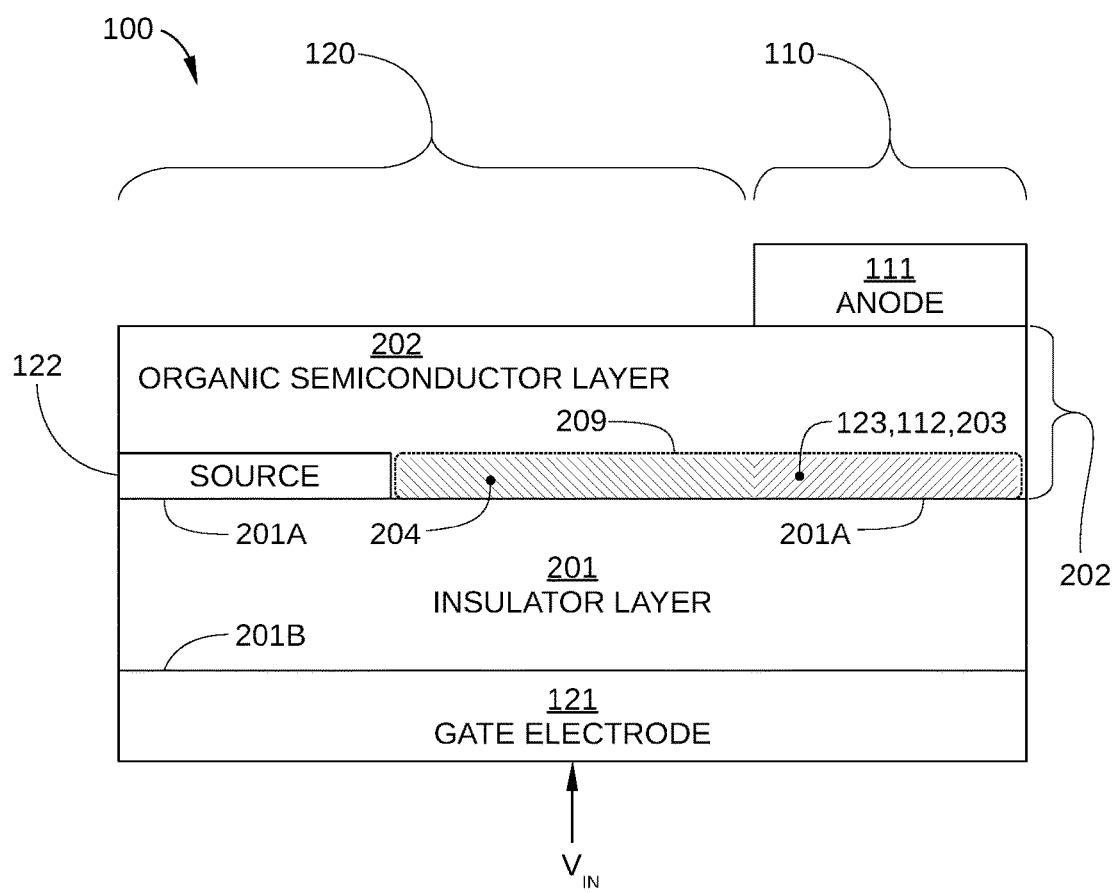
FIG. 2 illustrates a simplified schematic cross-sectional view of a MOTLED, arranged in accordance with at least some embodiments of the present disclosure.

FIG. 2 illustrates a simplified schematic cross-sectional view of MOTLED 100, arranged in accordance with at least some embodiments of the present disclosure. MOTLED 100 includes an insulator layer 201, an organic semiconductor layer 202 formed on a first surface 201A of insulator layer 201, gate electrode 121 formed on a second surface 201B of insulator layer 201, source electrode 122, and anode 111. As noted previously, MOTLED 100 also includes a first region that functions as OLED 110 and a second region that functions as OTFT 120, where OTFT 120 is configured to control current flow to, and therefore optical output from, OLED 110. In operation, when voltage $V_{IN}$ is applied to gate electrode 121, an electron accumulation layer 209 is formed on the first surface 201A of the insulator 201 in the organic semiconductor 202. This electron accumulation layer 209 can be conceptually divided into two parts: a channel region 204 and an electron accumulation layer 203 that is disposed under anode 111, which serves as the drain of OTFT 120 and cathode 112 for OLED 110. Electrons are injected into organic semiconductor layer 202 from source electrode 122 and flow to the portion of electron accumulation layer 203 serving as drain electrode 123 via channel 204. These electrons then flows towards anode 111, where they recombine with the holes injected from anode 111 near the semiconductor-insulator interface. Thus, channel 204 is formed by accumulation of electrons at the semiconductor-insulator interface when a positive $V_{gs}$ is applied to gate electrode 121, i.e., $V_{IN}$. This accumulation exists until current flows to the drain electrode in OTFT 120, i.e., drain electrode 123. In MOTLED 100, this accumulation is extended throughout the interface, therefore channel 204 and electron accumulation layer 203 are both part of the same electron accumulation layer, with electron accumulation layer 203 acting as an electrode. Consequently, electron accumulation layer 203 shown in FIG. 2 is configured to serve as cathode 112 of OLED 110 and drain electrode 123.

Insulator layer 201 may be any feasible dielectric layer suitable for the formation of an OTFT combined with an OLED, and is configured as a gate dielectric layer of MOTLED 100. For example, in some embodiments, insulator layer 201 may be a fluorinated polymer, such as CYTOP. In some embodiments, insulator layer 201 may be a multilayer dielectric, such as a bilayer dielectric, that includes a fluorinated polymer and a high-k metal-oxide layer created by atomic layer deposition. Generally, insulator layer 201 comprises a flexible material, thereby facilitating roll-to-roll printing technologies for the formation of MOTLED 100.

Organic semiconductor layer 202 may be formed on first surface 201A of insulator layer 201 and may include an organic semiconductor material that can serve as both the semiconductor portion of OLED 110 and as the semiconductor portion of OTFT 120. Because OLED 110 may not include a metallic anode 111, certain constraints, described below, may be placed on the particular electron mobility, hole mobility, and electrical resistance of the organic semiconductor material included in organic semiconductor layer 202.

In embodiments in which organic semiconductor layer 202 includes a p-type organic semiconductor material, hole mobility in a bulk portion of organic semiconductor layer 202 may be significantly greater than electron mobility in the bulk portion of organic semiconductor layer 202. For example, in one such embodiment, hole mobility in the bulk portion of organic semiconductor layer 202 may be approximately five times greater than electron mobility in the bulk portion of organic semiconductor layer 202. In another such embodiment, hole mobility in the bulk portion of organic semiconductor layer 202 may be approximately an order of magnitude or more than electron mobility in the bulk portion of organic semiconductor layer 202. In such embodiments, this greater hole mobility can facilitate holes injected from anode 111 to recombine with electrons close to the electron accumulation layer 203 of OLED 110, thereby obtaining efficient light emission across substantially all of electron accumulation layer 203.

In order to avoid current crowding close to the portion of anode 111 that is adjacent to channel region 204, thereby ensuring that current may be somewhat evenly spread across anode 111, the electrical resistance of electron accumulation layer 203 may be selected to be low enough so that electron mobility therein is larger than hole mobility in the bulk. Analysis has shown that electron mobility in electron accumulation layer 203 should be sufficiently greater than hole mobility in a bulk portion of organic semiconductor layer 202 for operation of some embodiments of MOTLED 100. This is in contrast to the hole and electron mobility described above for the bulk portion of organic semiconductor layer 202, where hole mobility may be an order of magnitude greater than electron mobility in the bulk portion. However, it is well known that mobility of carriers in channel region 204 can be orders of magnitude larger than that in a bulk portion of organic semiconductor layer 202, since carrier mobility in many organic semiconductors increases significantly with carrier density. Since electron density in electron accumulation layer 203 is several orders of magnitude higher than that in the bulk portion of organic semiconductor layer 202, the electron mobility in electron accumulation layer 203 can be orders of magnitude higher than the electron mobility in bulk as well. Thus, even though organic semiconductor layer 202 may be selected to have a hole mobility that is higher than electron mobility in a bulk portion thereof, in the same material electron mobility can simultaneously be higher than hole mobility in electron accumulation layer 203. In some embodiments, organic semiconductor layer 202 may include any p-type organic light-emissive semiconductor material that meets the above-described requirements. Tetracene ($C_{18}H_{12}$) is one such material suitable for use in organic semiconductor layer 202 for realizing the MOTLED structure. Other suitable materials for use in organic semiconductor layer 202 include poly[2-methoxy-5-(3',7'-dimethyloctyloxy)]-p-phenylene vinylene (OC1C10-PPV), F8BT, SQ1, etc., which are light-emitting materials and suitable for ambipolar transistors. If electron mobility is lower than hole mobility in the bulk portion of organic semiconductor layer 202, then OTFT 120 should be operated as an n-channel transistor with electron accumulation layer 203 as drain and cathode of OLED 110. If electron mobility is higher than hole mobility in bulk region, then OTFT 120 should be operated as a p-channel transistor with a hole accumulation layer (instead of electron accumulation layer 203) as drain of OTFT 120 and as anode 111 of OLED 110.

Gate electrode 121 may be formed from a conductive layer deposited on insulator layer 201, such as a patterned indium-tin oxide layer. In operation, voltage applied to gate electrode 121 causes the formation of electron accumulation layer 203 at the organic semiconductor-insulator interface (i.e., channel region 204 and electron accumulation layer virtual electrode 203). Because at least part of electron accumulation layer 203 serves as drain electrode 123 of OTFT 120, voltage applied to gate electrode 121 controls the amount of charge carriers flowing between source electrode 122 and at least part of electron accumulation layer 203.

Source electrode 122 can be formed from a conductive layer deposited on insulator layer 201 and anode 111 can be formed from a similar conductive layer deposited on organic semiconductor layer 202. In some embodiments, source electrode 122 and anode 111 may be formed from the same or from different materials. Suitable materials for source electrode 122 and anode 111 include a patterned molybdenum or indium-tin oxide layer, or other metals. Source electrode 122 is electrically coupled to organic semiconductor layer 202 and is configured to function as a source electrode for OTFT 120. Anode 111 is electrically coupled to organic semiconductor layer 202 and is configured to function as an anode for OLED 110.

Figure 3:
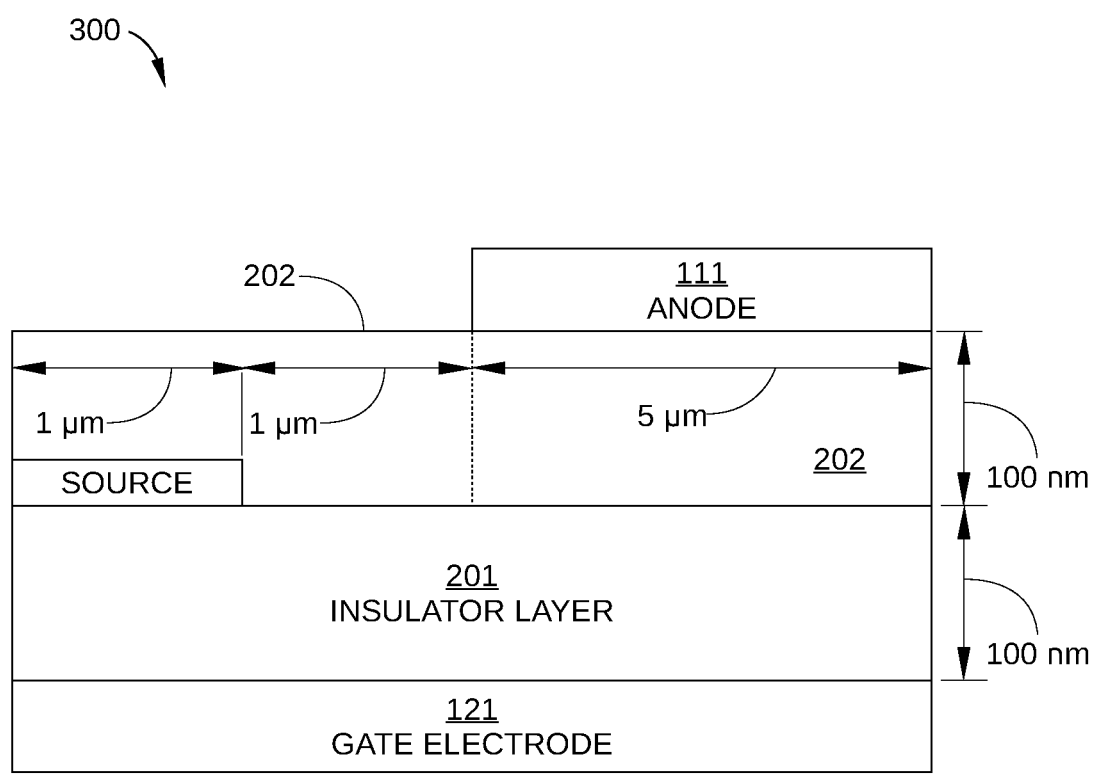
FIG. 3 illustrates a simplified schematic cross-sectional view of a simulated MOTLED, arranged in accordance with at least some embodiments of the present disclosure.

In order to verify the operation and quantify the advantages of MOTLED 100, simulations were carried out using the organic device simulation module of ATLAS, a two-dimensional device simulator used widely by both industry and academic institutions to investigate feasibility of new designs and evaluate performance. FIG. 3 illustrates a simplified schematic cross-sectional view of a simulated MOTLED 300, arranged in accordance with at least some embodiments of the present disclosure. As shown, organic semiconductor layer 202 and insulator layer 201 of MOT- LED 300 each have a thickness of 100 nm, the source electrode and channel region 204 each have a length of 1 micron, and anode 111 has a length of 5 microns. Width of MOTLED 300 is taken as 1 micron. Additional material parameters of the different constituent layers of MOTLED 300 used for these simulations are presented in Table 1.

TABLE 1

| | |
|---|---|
| $\mu_p$ (bulk) | $10^{-5}$ cm$^2$V$^{-1}$s$^{-1}$ |
| $\mu_n$ (bulk) | $10^{-6}$ cm$^2$V$^{-1}$s$^{-1}$ |
| $\mu_n$ (channel) | $10^{-1}$, $10^{-2}$, $10^{-3}$ cm$^2$V$^{-1}$s$^{-1}$ |
| Energy Gap | 3.0 eV |
| Ionization Potential | 5.4 eV |
| Conduction and Valence Band Density of States | $10^{21}$ cm$^{-3}$ |
| Insulator | Oxide with no leakage |
| Source Contact | No barrier for hole injection (work function = 2.4), e.g., Ca |
| Drain/Anode Contact | No barrier for hole injection (work function = 5.4), e.g., Au |

Figure 4:
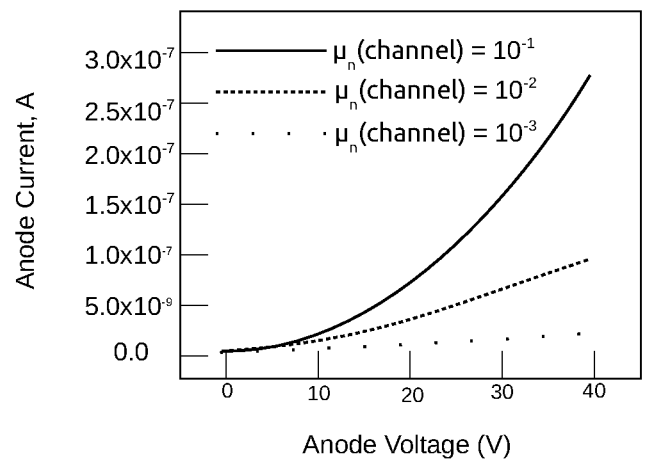
FIG. 4 shows the variation of anode current with anode voltage $V_A$ in a simulated MOTLED device arranged in accordance with at least some embodiments of the present disclosure.

FIG. 4 shows the variation of anode current with anode voltage $V_A$ in a simulated MOTLED device, arranged in accordance with at least some embodiments of the present disclosure. For the results shown in FIG. 4, $V_{GS}$=40 V, where $V_{GS}$ is the voltage differential between gate electrode 121 and source electrode 122. FIG. 4 shows that anode current varies substantially linearly for the three different values of $\mu_n$ (channel) used in the simulations, indicating that OTFT 120 of MOTLED 300 is operating in linear mode of operation. This is in contrast to operating in saturation mode, which is employed in an OLET. Simulations also indicate that recombination occurs substantially between anode 111 and insulator layer 201, and not in channel region 204. Furthermore, simulations show that the recombination zone is fairly broad across electron accumulation layer 203 and is not a linear, strip-like region in the center of channel region 204, which is the case in an OLET. Consequently, due to this larger light-emissive area, MOTLED 300 is generally well-suited for use in a display.

Figure 5:
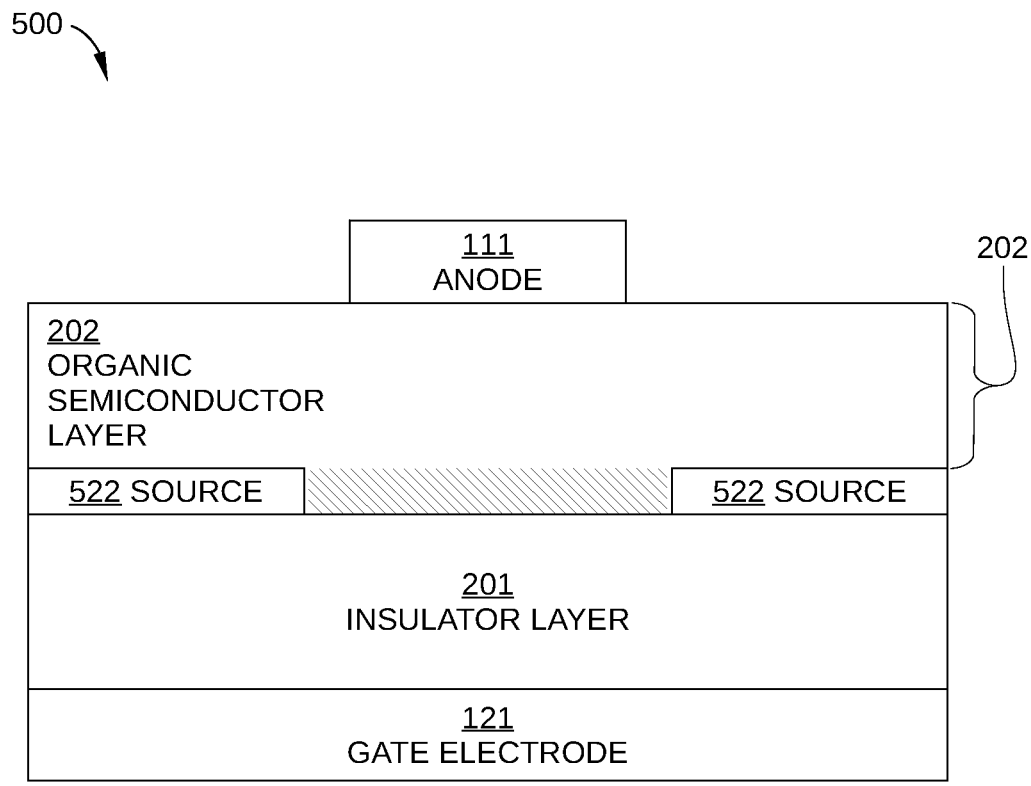
FIG. 5 illustrates a schematic cross-sectional view of a MOTLED configured with two source electrodes, arranged in accordance with at least some embodiments of the present disclosure.

To make recombination rate more uniform under the anode electrode of a MOTLED, in some embodiments, a MOTLED structure is configured with two source electrodes that are shorted together. FIG. 5 illustrates a schematic cross-sectional view of a MOTLED 500 configured with two source electrodes, arranged in accordance with at least some embodiments of the present disclosure. As shown, MOTLED 500 may be substantially similar in configuration to MOTLED 200 in FIG. 2, except that MOTLED 500 includes first and second source electrodes 522 that are electrically coupled. In some embodiments, anode 111 is disposed equidistant between first and second source electrodes 522. In such embodiments, recombination may be more uniform under anode 111, thereby leading to a more uniformly illuminated light emissive region in MOTLED 200. Simulations have indicated that a recombination profile for such embodiments are more uniform than for a MOTLED device that includes only a single source electrode. The results of one such simulation are illustrated in FIG. 6.

Figure 6:
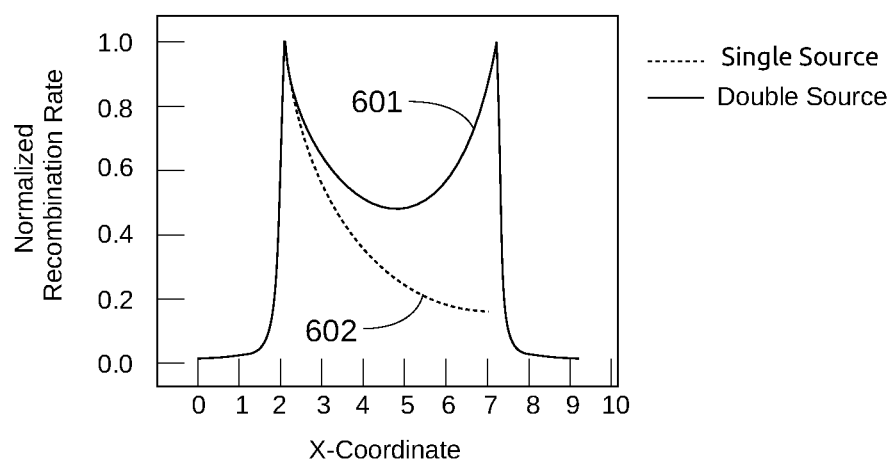
FIG. 6 compares recombination rate profiles for two simulated MOTLED devices.

FIG. 6 compares recombination rate profiles 601 and 602 for two simulated MOTLED devices in which $\mu_n$ (channel) =$10^{-2}$ cm$^2$ V$^{-1}$ s$^{-1}$. Recombination rate profile 602 shows recombination rate across an electron accumulation layer, such as electron accumulation layer 203 in FIG. 2, in a simulated MOTLED device having a single source electrode. Such a MOTLED device may be substantially similar in configuration to MOTLED 100 in FIG. 2. Recombination rate profile 601 shows recombination rate across an electron accumulation layer in a simulated MOTLED device having two source electrodes. Such a MOTLED device may be substantially similar in configuration to MOTLED 500 in FIG. 5. As shown, recombination rate profile 601 is significantly more uniform than recombination rate profile 602, indicating more uniform emission of light from the MOTLED device having two source electrodes.

The above embodiments describe various MOTLEDs in which organic semiconductor layer 202 includes a p-type organic semiconductor material, and hole mobility in a bulk portion of organic semiconductor layer 202 may be significantly greater than electron mobility in the bulk portion of organic semiconductor layer 202. Conversely, in embodiments in which organic semiconductor layer 202 includes an n-type organic semiconductor material, electron mobility in a bulk portion of organic semiconductor layer 202 may be significantly greater than hole mobility in the bulk portion of organic semiconductor layer 202. Furthermore, in such embodiments, a p-channel TFT would be connected to OLED 110, and electron accumulation layer 203 is instead a hole accumulation layer under the cathode of OLED and acts as the anode of OLED 110 and as the drain electrode of OTFT 120. In such embodiments, suitable n-type organic semiconductor materials for organic semiconductor layer 202 include ambipolar light emitting materials like-F8BT or SQ1.

Thus, embodiments of the disclosure provide a novel light-emissive device in which an OTFT structure is merged with an OLED structure by utilizing the electron accumulation layer in the OTFT as a common electrode for each structure. The advantages of some example light-emissive devices include less complex processing and a simpler OLED structure in comparison to fabricating discrete OTFT and OLED structures and externally integrating these structures. Furthermore, relative to a light-emitting transistor, some embodiments offer the advantage of a broader light emission area more suitable for use in display devices.

In some examples, a light emissive device (which may also be referred to as a light emitting device) includes a dielectric layer, a gate electrode located on a first side of the dielectric layer, an electrode (such as a source electrode) located on the second side of the dielectric layer, and a semiconductor layer disposed over at least a portion of the source electrode and a portion of the second side of the dielectric layer adjacent the source electrode. The light emissive device further includes an electrode (such as an anode electrode) supported by the semiconductor layer, where a portion of the semiconductor layer is located between the anode electrode and the dielectric layer.

In some examples, an electrical potential is applied between the source and the anode electrode of a light emissive device. Application of a gate voltage to the gate electrode induces a channel in the semiconductor layer, and, for example, electrons flow through the channel to an electron accumulation layer under the anode electrode. Holes are injected through the anode, and recombine with the electrons near the electron accumulation to form a radiative region near the dielectric substrate. The device may be a top emissive device, with generated light passing through a portion of the semiconductor layer and, at least in part, through the anode electrode. In other examples, a light emissive device may be configured as an edge-emissive device with light coming primarily from a region close to the edge of anode electrode.

In some examples, a light emissive device is a three-terminal device. A pair of electrical terminals are used to generate light emission from a radiative region of the device, for example through radiative recombination of electrons and holes. An additional electrode is used as a gate, and may be used to electrically modulate the light emission intensity. An example light emissive device may include a FET region and a light emissive region, where a single semiconductor layer extends through the FET region and the light emissive region.

In some examples, a light emissive device comprises a light emissive region through which charge carriers pass between a top electrode formed on a portion of the semiconductor layer and a charge carrier accumulation layer (such as a hole accumulation layer or electron accumulation layer) located proximate an interface between the semiconductor layer and an adjacent dielectric layer. The light emissive device may further comprise a FET (such as a lateral FET) region in which charge carriers pass between a FET electrode and the electron accumulation layer. The electron accumulation layer provides both one electrode of the FET (drain) and one electrode of the light emissive region (e.g. anode or cathode), depending on the device configuration.

In some examples, there may be a plurality of channel regions between the emissive region and (one or more) FET electrodes. In some examples, the channel region may be generally toroidal or include radial channels, with the light emissive region in the center and the FET electrode(s) arranged in an outer circular pattern, or vice versa.

In some examples, the semiconductor layer includes an organic semiconductor, such as a polymer organic semiconductor, oligomer organic semiconductor, or molecular organic semiconductor. In some examples, the semiconductor layer may include a polycyclic aromatic hydrocarbon, such as an acene. Example organic semiconductors include anthracene, tetracene, pentacene, hexacene, rubrene, and the like. If necessary, hole mobility may be adjusted using suitable dopant concentrations that can act as traps, allowing a wide range of organic semiconductors to be used in various examples.

In some examples, the semiconductor layer may be deposited by spin-coating, evaporation, vapor deposition, or any appropriate method.

In some examples, the dielectric layer may be a flexible layer, such as a polymer sheet. In some examples, the dielectric layer may comprise a polymer, dielectric oxide, glass, ceramic, or other dielectric material.

In some examples, a display device includes a plurality of light emissive devices such as described herein. An example display device may be a multiplexed display using multiplexed signals applied to respective gate electrodes. In some examples, a display device may be an active matrix emissive display, for example including an array of light emissive devices. In some examples, an electronic display device includes an array, such as a two-dimensional array, of light emissive elements such as example MOTLEDs described herein. In some examples, a display may be part of a television and/or video display. In some examples, a display may be part of an electronic device (such as a mobile electronic device), such as a telephone (such as a mobile phone such as a smartphones), personal organizer, computer (e.g. hand-held or otherwise portable), camera, body-mounted display (such as a head-mounted display), advertising display, alphanumeric display, signage (such as road signage or other informational display), and the like.

In some examples, a light emissive device may be used for optical communication, for example through modulation of the gate signal.

In some examples, a method of operating a light emissive device comprises applying an electrical potential to a gate electrode on one surface of a dielectric layer to control channel formation in a semiconductor layer on the other side of the dielectric layer, and applying an electrical signal to a pair of electrodes adjacent the semiconductor layer so that charge carriers pass through the channel region and recombine in an emissive region. In some examples, the emissive region is separated from one of the pair of electrodes by at least approximately the thickness of the semiconductor layer and from the other of the pair of electrodes by at least approximately the length of the channel region. The pair of electrodes may be located on opposite sides of the semiconductor layer and laterally spaced apart by at least approximately the length of the channel region.

In some examples, the emissive region may be located between reflective structures, and the light emissive device may be laser, for example a laser that is a combination of a lateral field effect transistor adjacent a top-emitting laser. In this context, top emission may be directed, on average, approximately normal to the plane of the substrate. In some examples, the semiconductor layer may have optical gain, for example through addition of one or more dopants. In some examples, one or more reflectors may be integrated into or located proximate the light emissive region, for example a dielectric reflector, for example to modify the emitted beam, and/or to increase emission efficiency.

In some examples, a light-emissive device comprises a semiconductor structure (such as an organic semiconductor structure), such as a layer, formed on a first surface of an insulator substrate, the light emissive device comprising a light-emitting diode that includes a LED portion of the semiconductor structure, and an LED electrode electrically coupled to the LED portion. The LED electrode is operable to inject first current carriers into the LED portion of the semiconductor structure. The light emissive device further comprises a thin film field effect transistor (FET) that includes a FET portion of the semiconductor structure, a FET electrode electrically coupled to the FET portion, and a gate electrode located on an opposite side of the insulator substrate from the semiconductor structure. During operation, an accumulation layer (of second carriers) forms proximate, substantially adjacent, or adjacent an interface between the semiconductor structure and the insulator substrate, and a portion of the accumulation layer effectively operates as a common electrode for both the LED and the FET portions of the semiconductor structure. In some examples, the accumulation layer is an electron accumulation layer, operable as a cathode to inject electrons into the LED portion of the semiconductor structure, and the LED electrode is an anode for the LED that injects holes into the LED portion. During operation of the device, light emission may result from recombination of electrons and holes in the LED portion of the semiconductor structure near the semiconductor-insulator interface. In some examples, the accumulation layer is an electron accumulation layer which acts as a drain for the FET portion, the FET electrode being a source for the FET portion of the semiconductor structure.

In some examples, a light-emissive device comprises a semiconductor structure (such as an organic semiconductor structure), such as a semiconductor layer, having only two electrodes in electrical communication (such as ohmic contact) with the semiconductor structure, and further having one or more gate electrodes. The semiconductor structure includes a FET portion, through which current flow may be controlled by an electrical signal applied to the gate electrode. The semiconductor structure further includes an LED portion, adjacent the FET portion, in which light emission occurs through carrier recombination. In some examples, the electrodes in electrical contact with the semiconductor structure are one electrode for the FET portion and one electrode for the LED portion. The second electrode for each of the FET and LED portions are provided by one or more carrier (e.g. electron) accumulation regions within the semiconductor structure, and need not be externally accessible. For example, the device may be configured so that a part of electron accumulation layer formed at the interface between the semiconductor layer and an insulator layer, being operable to inject electrons into the semiconductor structure and acts as the cathode electrode for the OLED. In some examples, the gate electrode is separated from the semiconductor structure by the insulator structure, but in other examples a gate electrode may be otherwise located.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A light-emissive device, comprising:
    an organic light-emitting diode that includes
        an insulator substrate;
        an organic semiconductor that is formed on a first surface of the insulator substrate and comprises a material in which a hole mobility characteristic is greater in a bulk region of the material than an electron mobility characteristic in the bulk region; and
        a first electrode that is electrically coupled to the organic semiconductor and is operable to inject holes into the organic semiconductor; and
    a thin film transistor that includes
        the organic semiconductor;
        a gate electrode that is disposed on a second surface of the insulator substrate; and
        a source electrode that is electrically coupled to the organic semiconductor and is operable to inject electrons into the organic semiconductor, wherein the thin film transistor is operable to form an electron accumulation layer at an interface between the organic semiconductor and the insulator substrate, and at least a portion of the electron accumulation layer is operable to function as a drain electrode for the thin film transistor and as a cathode of the organic light-emitting diode.

2. The light-emissive device of claim 1, wherein the light-emissive device is an electronic display device.

3. The light-emissive device of claim 1, comprising a layer of the organic semiconductor, the layer having a first portion within the organic light-emitting diode, and a second portion within thin film transistor.

4. The light-emissive device of claim 1, wherein the electron accumulation layer comprises a first portion and a second portion, wherein the first portion of the electron accumulation layer is configured to function as an emissive region of the organic light-emitting diode and also as the drain electrode of the thin film transistor and the second portion is configured to function as a channel for the thin film transistor.

5. The light-emissive device of claim 4, wherein the emissive region has a length that is at least equal to the length of an anode electrode of the organic light-emitting diode.

6. The light-emissive device of claim 5, wherein a length of the source electrode is less than the length of the emissive region.

7. The light-emissive device of claim 4, wherein the first portion is configured so that holes combine with electrons in the first portion to emit radiation.

8. The light-emissive device of claim 1, wherein the electron accumulation layer comprises a first portion that is configured to function as the drain electrode.

9. The light-emissive device of claim 1, wherein the organic semiconductor is disposed between the insulator substrate and the first electrode.

10. The light-emissive device of claim 1, wherein the organic semiconductor comprises a material in which the hole mobility characteristic is greater in the bulk region than the electron mobility characteristic in the bulk region so that light emission in the organic light-emitting diode takes place near the electron.

11. The light-emissive device of claim 1, wherein the second surface of the insulator substrate is disposed opposite and substantially parallel to the first surface of the insulator substrate.

12. The light-emissive device of claim 1, wherein the organic semiconductor comprises a p-type light-emitting material.

13. The light-emissive device of claim 12, wherein the p-type light-emitting material comprises tetracene ($C_{18}H_{12}$).

14. The light-emissive device of claim 1, wherein the organic semiconductor material is formed as a layer deposited on the insulator substrate.

15. The light-emissive device of claim 1, wherein the thin film transistor includes a second source electrode that is electrically coupled to the organic semiconductor and the organic light-emitting diode is disposed between the source electrode and the second source electrode.

16. The light-emissive device of claim 1, wherein the organic semiconductor comprises a material in which an electron mobility characteristic in a channel region is sufficiently greater than the hole mobility characteristic in the bulk region, so that a current flow and light emission occur uniformly under the anode electrode.

17. The light-emissive device of claim 1, wherein the organic light-emitting diode does not include a metallic electrode configured to inject electrons into the semiconductor material.

18. The light-emissive device of claim 1, wherein the thin film transistor does not include a metallic electrode configured as a drain electrode.

19. An apparatus, comprising:
    a memory;
    a processor coupled to the memory; and
    a light-emitting device coupled to the processor, the light-emitting device comprising:
        an organic light-emitting diode that includes an organic semiconductor that comprises a material in which a hole mobility is greater in a bulk region of the material than an electron mobility in the bulk region, is formed on a first surface of an insulator substrate, and is electrically coupled to a first electrode configured to inject holes into the organic semiconductor material; and a thin film transistor that includes the organic semiconductor;

a second electrode that is disposed on a second surface of the insulator substrate and is configured as a gate electrode for the thin film transistor; and a third electrode that is electrically coupled to the organic semiconductor and is configured to function as a source electrode for the thin film transistor and is operable to inject electrons into the organic semiconductor, wherein the thin film transistor is operable to form an electron accumulation layer at an interface between the organic semiconductor and the insulator substrate, and at least a portion of the electron accumulation layer is configured to function as a drain electrode for the thin film transistor and as a cathode of the organic light-emitting diode.

20. The apparatus of claim 19, wherein the organic light-emitting diode does not include a metallic electrode configured to inject electrons into the semiconductor material.

21. The apparatus of claim 19, wherein the thin film transistor does not include a metallic electrode configured as a drain electrode.

22. The apparatus of claim 19, wherein a first portion of the electron accumulation layer is configured to function as an emissive region as well as cathode electrode of the organic light-emitting diode and a second portion of the electron accumulation layer is configured to function as a channel of the thin film transistor.

23. The apparatus of claim 19, wherein a portion of the electron accumulation layer is configured to function as a drain electrode.

24. The apparatus of claim 19, wherein the organic semiconductor is disposed between the insulator substrate and the first electrode.

25. The apparatus of claim 19, wherein the organic semiconductor comprises a material in which the hole mobility is greater in the bulk region than the electron mobility in the bulk region, so that the emission takes place near the accumulation layer.

26. The apparatus of claim 19, wherein the organic semiconductor comprises a material in which an electron mobility characteristic in a channel region is sufficiently greater than the hole mobility characteristic in the bulk region, so that a current flow and light emission occur uniformly under the anode electrode.

27. The apparatus of claim 19, wherein the apparatus is a computing device.

* * * * *